(12) United States Patent
Hayakawa et al.

(10) Patent No.: US 9,590,615 B1
(45) Date of Patent: Mar. 7, 2017

(54) INTEGRATED CIRCUIT AND SWITCHING POWER-SUPPLY DEVICE PERFORMING OUTPUT CONTROL THROUGH SWITCHING OPERATION

(71) Applicant: Sanken Electric Co., LTD., Niiza-shi, Saitama (JP)

(72) Inventors: Akira Hayakawa, Niiza (JP); Yoshimichi Tadamasa, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/858,162

(22) Filed: Sep. 18, 2015

(51) Int. Cl.
| | |
|---|---|
| *H02M 3/335* | (2006.01) |
| *H03K 17/16* | (2006.01) |
| *H03K 17/687* | (2006.01) |
| *H02M 1/00* | (2006.01) |
| *H02M 3/156* | (2006.01) |

(52) U.S. Cl.
CPC ...... *H03K 17/165* (2013.01); *H02M 3/33507* (2013.01); *H03K 17/687* (2013.01); *H02M 3/156* (2013.01); *H02M 2001/0009* (2013.01); *H02M 2001/0022* (2013.01); *H02M 2001/0032* (2013.01); *H02M 2001/0035* (2013.01)

(58) Field of Classification Search
CPC ............. H02M 3/33507; H02M 3/156; H02M 2001/0022; H02M 2001/0032; H02M 2001/0035
See application file for complete search history.

(56) References Cited

U.S. PATENT DOCUMENTS

| | | | |
|---|---|---|---|
| 9,024,613 B2 | 5/2015 | Murata | |
| 2011/0110126 A1* | 5/2011 | Morrish | H02M 1/44 363/21.18 |
| 2013/0300464 A1* | 11/2013 | Kleinpenning | H02M 3/33507 327/119 |
| 2013/0322128 A1* | 12/2013 | Takegami | H02M 3/33507 363/17 |
| 2014/0071717 A1 | 3/2014 | Murata | |
| 2015/0103565 A1* | 4/2015 | Shimamori | H02M 3/337 363/21.09 |
| 2016/0065080 A1* | 3/2016 | Pastrana | H02M 3/33507 363/21.12 |

FOREIGN PATENT DOCUMENTS

WO     2012-160588 A1    11/2012

* cited by examiner

*Primary Examiner* — Jue Zhang
*Assistant Examiner* — Lakaisha Jackson
(74) *Attorney, Agent, or Firm* — Banner & Witcoff, Ltd.

(57) ABSTRACT

An integrated circuit includes: an inductor; a switching element connected to the inductor in series; an oscillator, of which an oscillation frequency is variable; a control unit, which controls the oscillation frequency of the oscillator based on a signal according to an output voltage of a switching power-supply device; a drive signal generating unit, which generates a drive signal used for controlling the switching element based on an output of the oscillator; a drive circuit, which drives the switching element based on the drive signal generated by the drive signal generating unit; and an on-period intermittent control unit, which intermittently performs on-period extension control in which an on-period of the switching element is set to be longer than an on-period based on the drive signal in a state where the oscillation frequency is controlled not to be fixed by the control unit.

4 Claims, 5 Drawing Sheets

INTEGRATED CIRCUIT AND SWITCHING POWER-SUPPLY DEVICE PERFORMING OUTPUT CONTROL THROUGH SWITCHING OPERATION

TECHNICAL FIELD

The present disclosure relates to a switching power-supply device performing output voltage control through a switching operation and an integrated circuit used therein.

BACKGROUND ART

In switching power-supply devices performing output voltage control through a switching operation performed by a switching element connected to an inductor, by intentionally applying a slight timing fluctuation (jitter) to an oscillation frequency of an oscillator used for performing on-off control of the switching element, the spectrum of a switching noise is distributed, thereby reducing an EMI noise.

SUMMARY

The jitter is determined to be plus or minus several percents with respect to a set value of the oscillation frequency. Accordingly, when the oscillation frequency is constant, the EMI noise can be reduced according to a jitter that is intentionally applied. However, for example, in a case where the oscillation frequency is controlled based on a load state or the like, as the oscillation frequency becomes lower, the range of the fluctuation of the oscillation frequency becomes narrower, and the effect of reducing the EMI noise is lowered.

The present disclosure is in view of the situations described above, and an object thereof is to provide An integrated circuit used in a switching power-supply device capable of controlling power supply at high precision by suppressing an EMI noise and a switching power-supply device including the integrated circuit.

An integrated circuit according to the present disclosure is An integrated circuit used in a switching power-supply device including an inductor and a switching element connected to the inductor in series. The integrated circuit includes: an oscillator, of which an oscillation frequency is variable; an oscillation frequency control unit, which controls the oscillation frequency of the oscillator based on a signal according to an output voltage of the switching power-supply device; a drive signal generating unit, which generates a drive signal used for controlling the switching element based on an output of the oscillator; a drive circuit, which drives the switching element based on the drive signal generated by the drive signal generating unit; and an on-period intermittent control unit, which intermittently performs on-period extension control in which an on-period of the switching element is set to be longer than an on-period based on the drive signal in a state where the oscillation frequency is controlled not to be fixed by the oscillation frequency control unit.

A switching power-supply device according to the present disclosure includes: an inductor; a switching element connected to the inductor in series; and the integrated circuit described above.

According to the present disclosure, there are provided An integrated circuit used in a switching power-supply device capable of controlling power supply at high precision by suppressing an EMI noise also in a case where an oscillation frequency changes and a switching power-supply device including the integrated circuit.

DETAILED DESCRIPTION

Hereinafter, embodiments of the present disclosure will be described with reference to the drawings.

Figure 1:
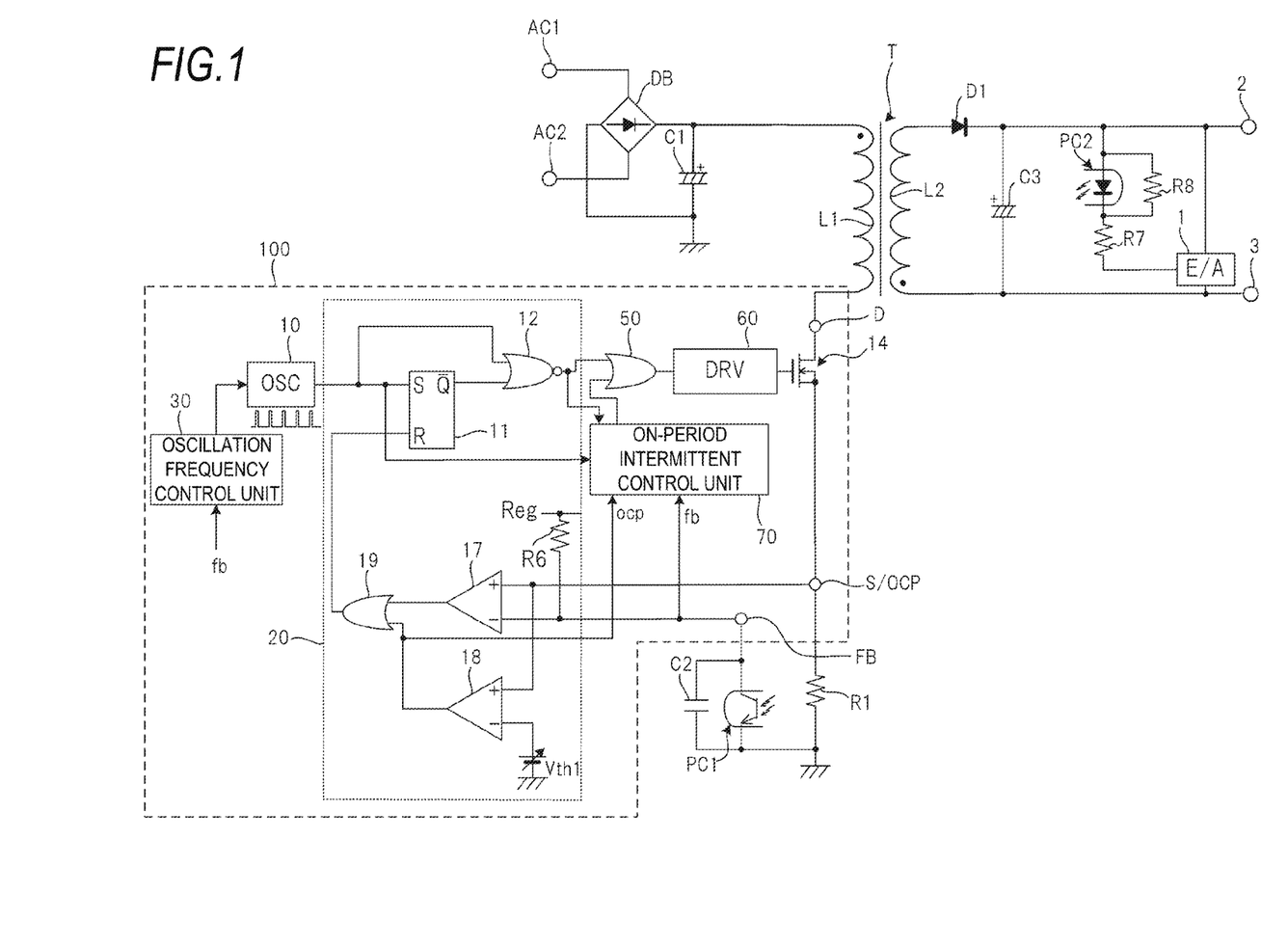
FIG. 1 is a circuit diagram of a switching power-supply device according to an embodiment of the present disclosure.

FIG. 1 is a circuit diagram illustrating the internal configuration of a switching power-supply device according to an embodiment of the present disclosure.

A primary-side circuit of the switching power-supply device illustrated in FIG. 1 includes: a rectifier circuit D1; capacitors C1 and C2; a primary coil L1 (inductor) constituting a transformer T; a controller IC 100 that is an integrated circuit; a current detection resistor R1; and a light receiving transistor PC1 constituting a photo-coupler.

A secondary-side circuit of the switching power-supply device illustrated in FIG. 1 includes: a secondary coil L2 constituting the transformer T with magnetically coupling with the primary coil L1; a diode D1 and a smoothing capacitor C3 constituting a rectifying and smoothing circuit that rectifies and smooths an output voltage of the secondary coil L2; a light emitting diode PC2 constituting a photo-coupler; resistors R7 and R8; and an error amplifier (E/A) 1.

Two output terminals of the secondary-side circuit include a ground output terminal 3 connected to the ground and a non-ground output terminal 2 not connected to the ground.

A commercial AC power source is connected to AC input terminals AC1 and AC2 of the rectifier circuit DB where a diode is constituted as a bridge. An AC voltage input from the commercial AC power source is full-wave rectified and is output from the rectifier circuit DB.

Between a rectifier-output positive terminal and a rectifier-output negative terminal of the rectifier circuit DB, the capacitor C1 is connected. The rectifier-output negative terminal of the rectifier circuit DB is grounded. As described above, a DC voltage acquired by rectifying and smoothing an AC voltage supplied from the commercial AC power source by using the rectifier circuit DB and the capacitor C1 is acquired.

The controller IC 100 includes a switching element 14 such as a power metal oxide semiconductor field effect transistor (MOSFET) and controls a voltage output from the secondary-side circuit by performing on-off control (switching control) of the switching element 14.

The controller IC 100 includes: a D terminal connected to the drain of the switching element 14; an S/OCP (MOSFET source/over current protection) terminal connected to the source of the switching element 14; and an FB (feedback signal input) terminal.

The transformer T supplying power from the primary-side circuit to the secondary-side circuit is constituted by the primary coil L1 and the secondary coil L2 that magnetically couples with the primary coil L1.

The rectifier-output positive terminal of the rectifier circuit DB is connected to one end of the primary coil L1 of the transformer T, and the other end of the primary coil L1 of the transformer T is connected to the D terminal of the controller IC 100. The S/OCP terminal of the controller IC 100 is grounded through the current detection resistor R1.

The current detection resistor R1 is a current detection circuit used for detecting a drain current flowing through the switching element 14. According to the current detection resistor R1, a voltage generated at the S/OCP terminal of the controller IC 100 is input to the controller IC 100 as a drain current detection signal Id that is a voltage signal corresponding to a current (drain current) flowing through the switching element 14.

Between the FB terminal and a ground terminal of the controller IC 100, the light receiving transistor PC1 constituting a photo-coupler and the capacitor C2 are connected in parallel. The light receiving transistor PC1 converts light received from the light emitting diode PC2 of the secondary-side circuit into an electric signal. A feedback signal fb transmitted from the secondary-side circuit through the photo-coupler is input to the FB terminal. This feedback signal fb configures a signal according to an output voltage of the switching power-supply device.

The diode D1 of the secondary-side circuit is connected between the secondary coil L2 and the non-ground side output terminal 2.

The smoothing capacitor C3 of the secondary-side circuit has a positive terminal connected to a connection point of the cathode of the diode D1 and the non-ground side output terminal 2 and a negative terminal connected to the ground-side output terminal 3.

A voltage induced to the secondary coil L2 of the transformer T is rectified and smoothed by the diode D1 and the smoothing capacitor C3, and a voltage between the terminals of the smoothing capacitor C3 is output from an output terminal as an output voltage. A line connected to the positive terminal of the smoothing capacitor C3 becomes a power supply line, and a line connected to the negative terminal of the smoothing capacitor C3 becomes a GND line.

Between the power supply line and the GND line, the error amplifier 1 is connected. The error amplifier 1 controls a current flowing through the light emitting diode PC2 of the photo-coupler in accordance with a difference between an output voltage and a reference voltage Vref.

As described above, a feedback signal according to the output voltage is transmitted from the light emitting diode PC2 to the light receiving transistor PC1 of the primary side and is input to the FB terminal of the controller IC 100 as the feedback signal fb.

In addition to the switching element 14, the controller IC 100 includes: an oscillator 10; a drive signal generating unit 20; an oscillation frequency control unit 30; an OR circuit 50; a drive circuit 60; and an on-period intermittent control unit 70.

The oscillator 10 has a variable oscillation frequency, and the oscillation frequency of an output pulse signal is controlled by the oscillation frequency control unit 30. An output signal of the oscillator 10 is input to the drive signal generating unit 20 and the on-period intermittent control unit 70.

In consideration of EMI reduction, the oscillator 10 applies a fluctuation to the oscillation frequency in a range (referred to as a jitter range) of plus or minus 5 percents (the numerical value is not limited thereto) of the reference frequency, with respect to an oscillation frequency (also referred to as a reference frequency) controlled by the oscillation frequency control unit 30.

In description presented here, a state where the oscillation frequency varies in the jitter range is handled as the same as a state where the oscillation frequency is fixed to the reference frequency within the jitter range.

The oscillation frequency control unit 30 controls the oscillation frequency (reference frequency) of the oscillator 10 based on a feedback signal fb input to the FB terminal.

Specifically, in a case where the signal level of the feedback signal fb is in a predetermined range (hereinafter, referred to as a frequency variable-control range), the oscillation frequency control unit 30 lowers the reference frequency as the signal level is lower. In a case where the signal level of the feedback signal fb is out of the frequency variable-control range as described above, the oscillation frequency control unit 30 fixes the reference frequency to a certain value.

The drive signal generating unit 20 generates a drive signal for controlling the switching element 14 based on a pulse signal supplied from the oscillator 10.

In the example illustrated in FIG. 1, the drive signal generating unit 20 includes: an RS flip-flop (hereinafter, referred to as an RS-FF) 11; a NOR circuit 12; comparators 17 and 18; an OR circuit 19; and a resistor R6.

The comparator 17 is configured such that a drain current detection signal Id is input to a non-inverted input terminal from the S/OCP terminal and a feedback signal fb is input to an inverted input terminal from the FB terminal.

The comparator 17 outputs a signal of a high level in a case where the drain current detection signal Id input to the non-inverted input terminal is the feedback signal fb input to the inverted input terminal or more.

The comparator 18 is configured such that a threshold voltage Vth1 used for detecting an overcurrent is input to an inverted input terminal, and a drain current detection signal Id is input to a non-inverted input terminal from the S/OCP terminal.

The comparator 18 compares the drain current detection signal Id with the threshold voltage Vth1 and outputs a signal of a high level in a case where the drain current detection signal Id is the threshold voltage Vth1 or more.

The OR circuit 19 is configured to receive an output signal of the comparator 17 and an output signal of the comparator 18 as inputs.

The OR circuit 19 outputs a signal of a high level in a case where a signal of a high level is input from any one of the comparator 17 and the comparator 18.

The RS-FF 11 is configured such that a pulse signal (the output signal of the oscillator 10) supplied from the oscillator 10 is input to a set terminal S, and an output signal of the OR circuit 19 is input to a reset terminal R.

The NOR circuit 12 is configured to be input a signal output from an inverted output terminal Q⁻ of the RS-FF 11 and a pulse signal supplied from the oscillator 10.

An output signal of the NOR circuit 12 is input to the OR circuit 50 and the on-period intermittent control unit 70. A signal of the high level output from the NOR circuit 12 configures an on-drive signal used for turning on the switching element 14. A signal of the low level output from the NOR circuit 12 configures an off-drive signal used for turning off the switching element 14.

Timing at which the RS-FF 11 is reset is determined based on an output signal of the comparator 17. In other words, the drive signal generating unit 20 performs pulse width modulation (PWM) control for controlling the width of the on-drive signal based on the feedback signal fb and the drain current detection signal Id such that a voltage output from the secondary-side circuit becomes the reference voltage Vref.

The OR circuit 50 is configured to receive a control signal output from the on-period intermittent control unit 70 and a drive signal output from the OR circuit 12 as inputs. An output signal of the OR circuit 50 is input to the drive circuit 60.

The drive circuit 60 drives the switching element 14 based on the drive signal generated by the drive signal generating unit 20.

The drive circuit 60 turns on the switching element 14 while a signal of the high level is input from the OR circuit 50 and turns off the switching element 14 while a signal of the low level is input from the OR circuit 50.

In a case where the oscillation frequency of the oscillator 10 is in a non-fixed state (a state where the signal level of the feedback signal fb input from the FB terminal is in the frequency variable-control range), the on-period intermittent control unit 70 intermittently performs on-period extension control, in which the on-period of the switching element 14 is extended to be longer than the on-period that is based on the on-drive signal generated by the drive signal generating unit 20.

Specifically, the on-period intermittent control unit 70 performs the on-period extension control described above, every plural times of generation of an on-drive signal by the drive signal generating unit 20.

The on-period intermittent control unit 70 does not perform the on-period extension control described above in a case where the oscillation frequency of the oscillator 10 is in the fixed state (a state where the signal level of the feedback signal fb is out of the frequency variable-control range).

When the on-period extension control described above is performed, the on-period intermittent control unit 70, in synchronization with the start of a period where the output signal of the NOR circuit 12 is at the high level, inputs a control signal that is at the high level for a period longer than the period to the OR circuit 50.

Accordingly, the on-period of the switching element 14 is set to be longer than the on-period (a period where the drive signal generated by the drive signal generating unit 20 is at the high level) that is based on the drive signal generated by the drive signal generating unit 20.

When this on-period extension control is performed, the on-period intermittent control unit 70 sets the extended time of the on-period of the switching element 14 to be longer as the oscillation frequency of the oscillator 10 is lower (the signal level of the feedback signal fb is lower).

Figure 2:
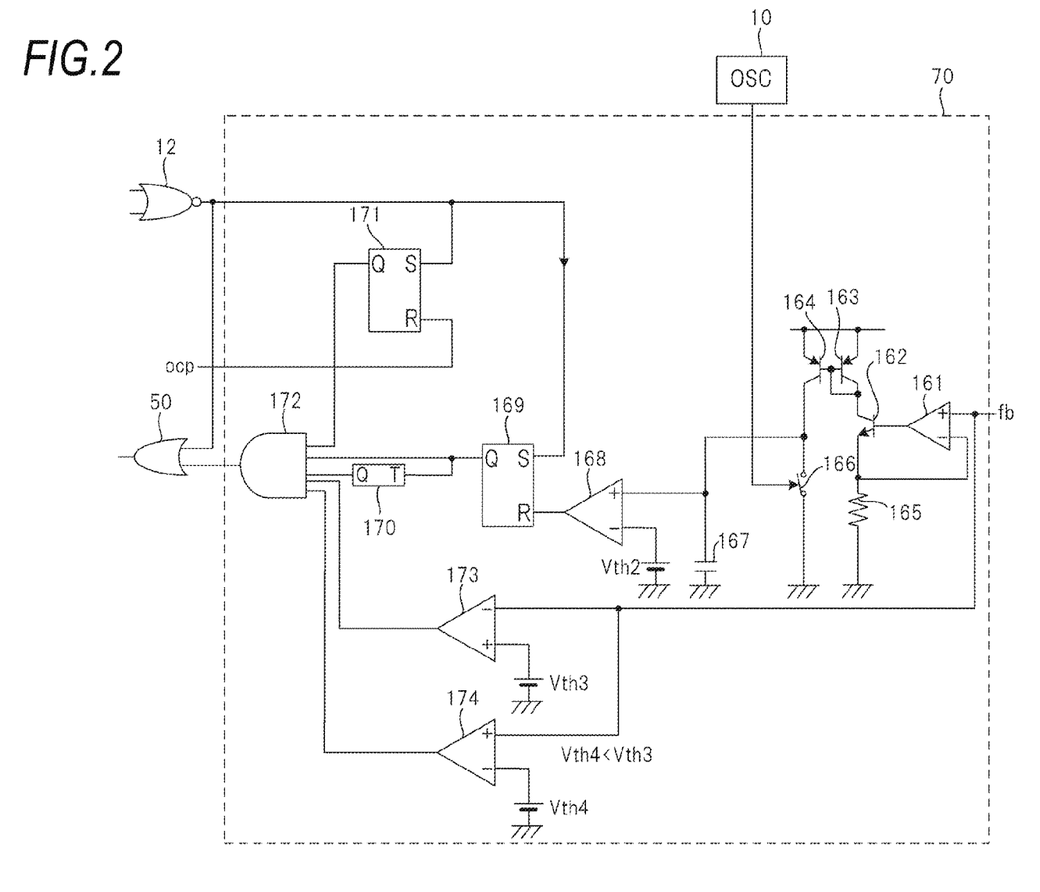
FIG. 2 is a circuit diagram illustrating an example of the internal configuration of an on-period intermittent control unit of the switching power-supply device illustrated in FIG. 1.

FIG. 2 is a circuit diagram illustrating an example of the internal configuration of the on-period intermittent control unit 70 of the switching power-supply device illustrated in FIG. 1.

The on-period intermittent control unit 70 illustrated in FIG. 2 includes: a comparator 161; a bipolar transistor 162; a bipolar transistor 163 and a bipolar transistor 164 constituting a current mirror circuit; a resistor 165; a switch 166; a capacitor 167; a comparator 168; an RS-FF 169; a T-type flip-flop (hereinafter, referred to as a T-FF) 170; an RS-FF 171; an AND circuit 172; a comparator 173; and a comparator 174.

The comparator 161 has a non-inverted input terminal connected to the FB terminal, an inverted input terminal connected to a connection point of the resistor 165 and the bipolar transistor 162, and an output terminal connected to a base of the bipolar transistor 162.

One end of the resistor 165 is connected to the ground terminal, and the other end of the resistor 165 is connected to an emitter of the bipolar transistor 162.

The bipolar transistor 163 is connected between the power supply line and the bipolar transistor 162. A base of the bipolar transistor 163 is connected to a base of the bipolar transistor 164 and a collector of the bipolar transistor 162.

The bipolar transistor 164 is connected between the power supply line and a movable end of the switch 166. A fixed end of the switch 166 is connected to the ground terminal. The opening or closing of the switch 166 is controlled according to an output signal of the oscillator 10.

The switch 166 is closed when the output of the oscillator 10 becomes the high level, and the switch 166 is open when the output of the oscillator 10 becomes the low level.

The capacitor 167 is connected between a connection point of the bipolar transistor 164 and the switch 166 and the ground terminal. The capacitor 167 is discharged in a case where switch 166 is closed, and the capacitor 167 is charged by the current mirror circuit in a case where the switch 166 is open.

The comparator 168 is configured such that the voltage of the capacitor 167 is input to a non-inverted input terminal, and a threshold voltage Vth2 is input to an inverted input terminal.

The RS-FF 169 is configured such that an output signal of the comparator 168 is input to a reset terminal R and an output signal of the NOR circuit 12 is input to a set terminal S. An output terminal Q of the RS-FF 169 is connected to an input terminal of the AND circuit 172 and an input terminal of the T-FF 170.

The comparator 173 is configured such that a feedback signal fb is input to an inverted input terminal and a threshold voltage Vth3 is input to a non-inverted input terminal. An output terminal of the comparator 173 is connected to an input terminal of the AND circuit 172.

The comparator 174 is configured such that the feedback signal fb is input to a non-inverted input terminal and a threshold voltage Vth4 is input to an inverted input terminal. The threshold voltage Vth4 is lower than the threshold voltage Vth3. An output terminal of the comparator 174 is connected to an input terminal of the AND circuit 172.

The threshold voltage Vth3 is an upper limit value of the frequency variable-control range, and the threshold voltage Vth4 is a lower limit value of the frequency variable-control range.

An output terminal Q of the T-FF 170 is connected to an input terminal of the AND circuit 172.

The RS-FF 171 is configured such that an output signal ocp of the comparator 18 illustrated in FIG. 1 is input to a reset terminal R, and an output signal of the NOR circuit 12 is input to a set terminal S. An output terminal Q of the RS-FF 171 is connected to an input terminal of the AND circuit 172.

An output terminal of the AND circuit 172 is connected to an input terminal of the OR circuit 50. In a state where the feedback signal fb is out of the frequency variable-control range, the output of the comparator 173 or the comparator 174 is the low level, and accordingly, the output terminal of the AND circuit 172 constantly is at the low level.

The operation of the switching power-supply device configured as above will be described.

In a state (a heavy load state or a light load state) where the feedback signal fb is out of the frequency variable-control range, the oscillation frequency of the oscillator 10 is fixed to a certain value (here, the value is different between the light load state and the heavy load state).

In this state, when a pulse signal output from the oscillator 10 rises, the RS-FF 11 is in a set state, and when this pulse signal falls, the output of the NOR circuit 12 becomes the high level. When the output of the NOR circuit 12 becomes the high level, a drive signal of the high level is input to the drive circuit 60, and the switching element 14 is turned on.

When the switching element 14 is turned on, the drain current detection signal Id rises, and, when the drain current detection signal Id arrives at the level of the feedback signal fb, the output of the comparator 17 becomes the high level, whereby the RS-FF 11 is reset. Accordingly, a drive signal of the low level is input to the drive circuit 60, and the switching element 14 is turned off.

In the heavy load state or the light load state, since the output of the comparator 173 or the comparator 174 becomes the low level, and the output of the AND circuit 172 is constantly at the low level.

Accordingly, the output of the OR circuit 50 coincides with the output of the NOR circuit 12, and the on-off control of the switching element 14 is performed according to a drive signal generated by the drive signal generating unit 20.

As described above, in the heavy load state or the light load state, the PWM control is performed in a state where the oscillation frequency is fixed to a certain value based on the output signal of the oscillator 10, the feedback signal fb, and the drain current detection signal Id.

In the light load state, the control process may transit to an intermittent control mode in which a switching operation is intermittently performed in a state where the load is very low.

In a state (medium load state) where the feedback signal fb is in the frequency variable-control range, the oscillation frequency of the oscillator 10 is controlled to be a value that is proportional to the feedback signal fb by the oscillation frequency control unit 30. In such a state, the outputs of the comparator 173 and the comparator 174 become the high level.

Figure 3:
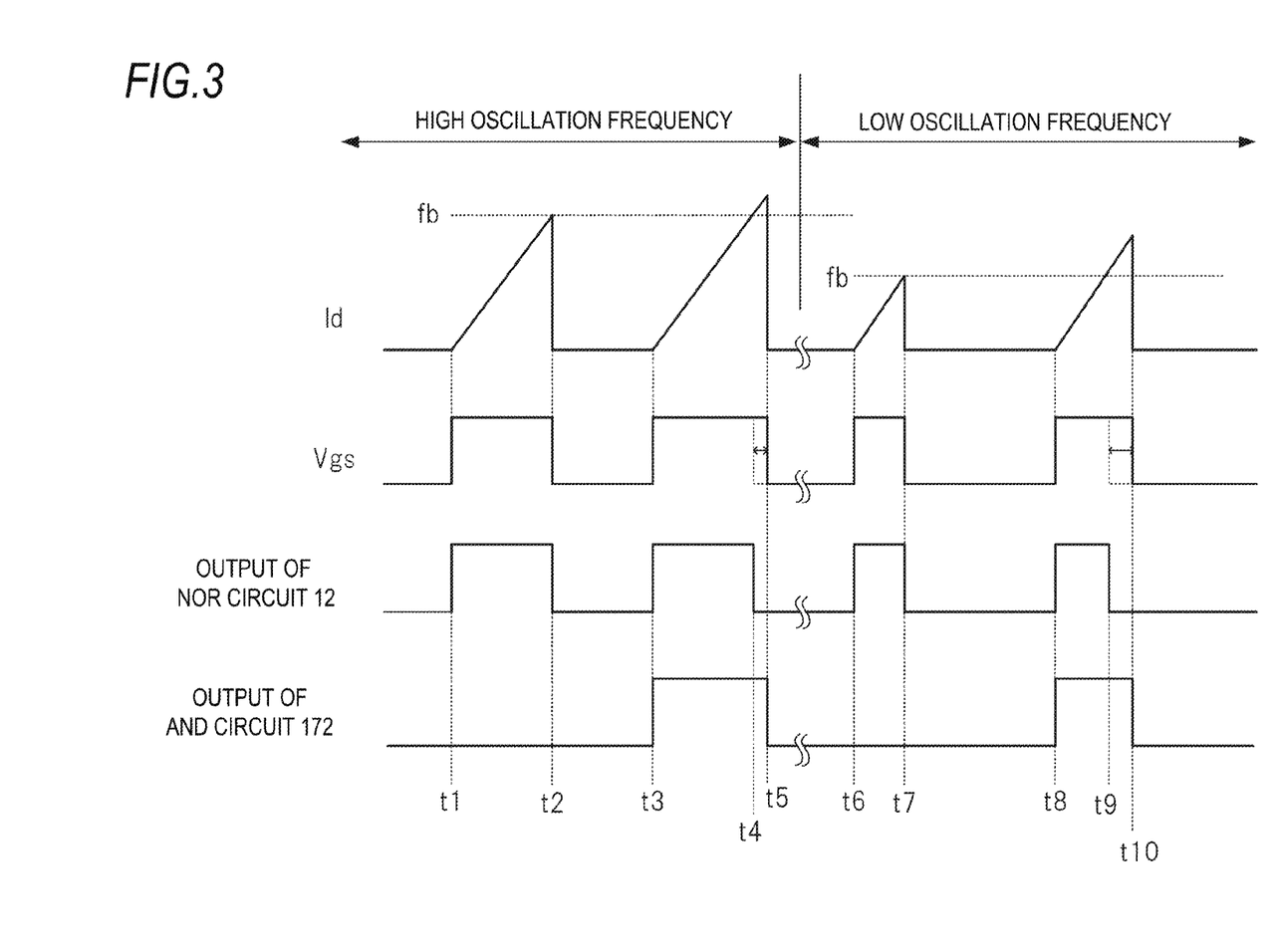
FIG. 3 is a timing diagram illustrating the operation of the switching power-supply device illustrated in FIG. 1 in a medium load state.

FIG. 3 is a timing diagram illustrating the operation of the switching power-supply device illustrated in FIG. 1 in a medium load state. In FIG. 3, a waveform during a period (a period of a high oscillation frequency) where the feedback signal fb is relatively high in the medium load state and a waveform during a period (a period of a low oscillation frequency) where the feedback signal fb is relatively low in the medium load state are extracted and illustrated.

In FIG. 3, "Id" represents a drain current detection signal. "Vgs" represents a signal input to the gate of the switching element 14.

In a state where a high oscillation frequency of the medium load state is set, when the output of the NOR circuit 12 becomes the high level at time point t1, the RS-FF 169 and the RS-FF 171 illustrated in FIG. 2 are set, and the input of the T-FF 170 becomes the high level. However, the output of the T-FF 170 is inverted to become the low level, and the output of the AND circuit 172 maintains the low level.

Since the output of the AND circuit 172 is maintained at the low level, the output of the OR circuit 50 coincides with the output of the NOR circuit 12, and the switching element 14 is turned on during a period of time point t1 to time point t2 in accordance with a drive signal of the high level output from the NOR circuit 12.

When the output of the NOR circuit 12 becomes the high level at time point t3 after the time point t2, the RS-FF 169 and the RS-FF 171 illustrated in FIG. 2 are set, the output of the T-FF 170 is inverted to become the high level, and the output of the AND circuit 172 becomes the high level.

Immediately before the time point t3, since the switch 166 illustrated in FIG. 2 is closed in accordance with the rise of the pulse signal of the oscillator 10, the capacitor 167 is discharged. Then, when it is the time point t3, the pulse signal of the oscillator 10 falls, and accordingly, the switch 166 illustrated in FIG. 2 is open, and the capacitor 167 is started to be charged according to a signal that is proportional to the feedback signal fb.

The capacitance of the capacitor 167 and the threshold voltage Vth2 input to the comparator 168 are designed such that the voltage of the capacitor 167 does not arrive at the threshold voltage Vth2 during a period of the rise to the fall of an on-drive signal output from the NOR circuit 12.

At time point t4 after the time point t3, while the output of the NOR circuit 12 changes to the low level, based on the design described above, at this time point, the voltage of the capacitor 167 does not arrive at the threshold voltage Vth2, and the output of the AND circuit 172 maintains the high level.

Accordingly, the output of the OR circuit 50 maintains the high level, and the switching element 14 is also maintained in the on state after the fall of the on-drive signal output from the NOR circuit 12.

Then, at time point t5 after the time point t4, when the voltage of the capacitor 167 arrives at the threshold voltage Vth2, the RS-FF 169 is reset, and the output of the AND circuit 172 is changed to the low level.

Accordingly, the output of the OR circuit 50 becomes the low level, whereby the switching element 14 is turned off. The operation described above is repeated.

In a state where a low oscillation frequency of the medium load state is set, when the output of the NOR circuit 12 becomes the high level at time point t6, the RS-FF 169 and the RS-FF 171 illustrated in FIG. 2 are set, the output of the T-FF 170 is inverted to become the low level, and the output of the AND circuit 172 maintains the low level.

Accordingly, the output of the OR circuit 50 coincides with the output of the NOR circuit 12, and the switching element 14 is turned on during a period of time point t6 to time point t7 in accordance with a drive signal of the high level output from the NOR circuit 12.

When the output of the NOR circuit 12 becomes the high level at time point t8 after the time point t7, the RS-FF 169 and the RS-FF 171 illustrated in FIG. 2 are set, the output of the T-FF 170 is inverted to become the high level, and the output of the AND circuit 172 becomes the high level.

Immediately before the time point t8, since the switch 166 illustrated in FIG. 2 is closed in accordance with the rise of the pulse signal of the oscillator 10, the capacitor 167 is discharged. Then, when it is the time point t8, the pulse signal of the oscillator 10 falls, and the switch 166 illustrated in FIG. 2 is open, and thus the capacitor 167 is started to be charged according to a signal that is proportional to the feedback signal fb.

In the time point t3 and the time point t8, the feedback signal fb at the time point t8 is lower than that at the time point t3. Accordingly, the speed of charging of the capacitor 167 starting at the time point t8 is lower than that of the capacitor 167 starting at the time point t3.

At time point t9 after the time point t8, the output of the NOR circuit 12 is changed to the low level. However, based on the design described above, the voltage of the capacitor 167 does not arrive at the threshold voltage Vth2 at this time point, and the output of the AND circuit 172 maintains the high level.

Accordingly, the output of the OR circuit 50 maintains the high level, and the switching element 14 is also maintained in the on state after the fall of the on-drive signal output from the NOR circuit 12.

Then, at time point t10 after the time point t9, when the voltage of the capacitor 167 arrives at the threshold voltage Vth2, the RS-FF 169 is reset, and the output of the AND circuit 172 is changed to the low level.

Since the speed of charging of the capacitor 167 starting at the time point t8 is lower than that of the capacitor 167 starting at the time point t3, a time interval from the time point t9 to the time point t10 is longer than that from the time point t4 to the time point t5.

When the output of the AND circuit 172 becomes the low level at time point t10, the output of the OR circuit 50 becomes the low level, and the switching element 14 is turned off.

In a state where the feedback signal fb is in the frequency variable-control range, the operation described above is repeated.

Figure 4:
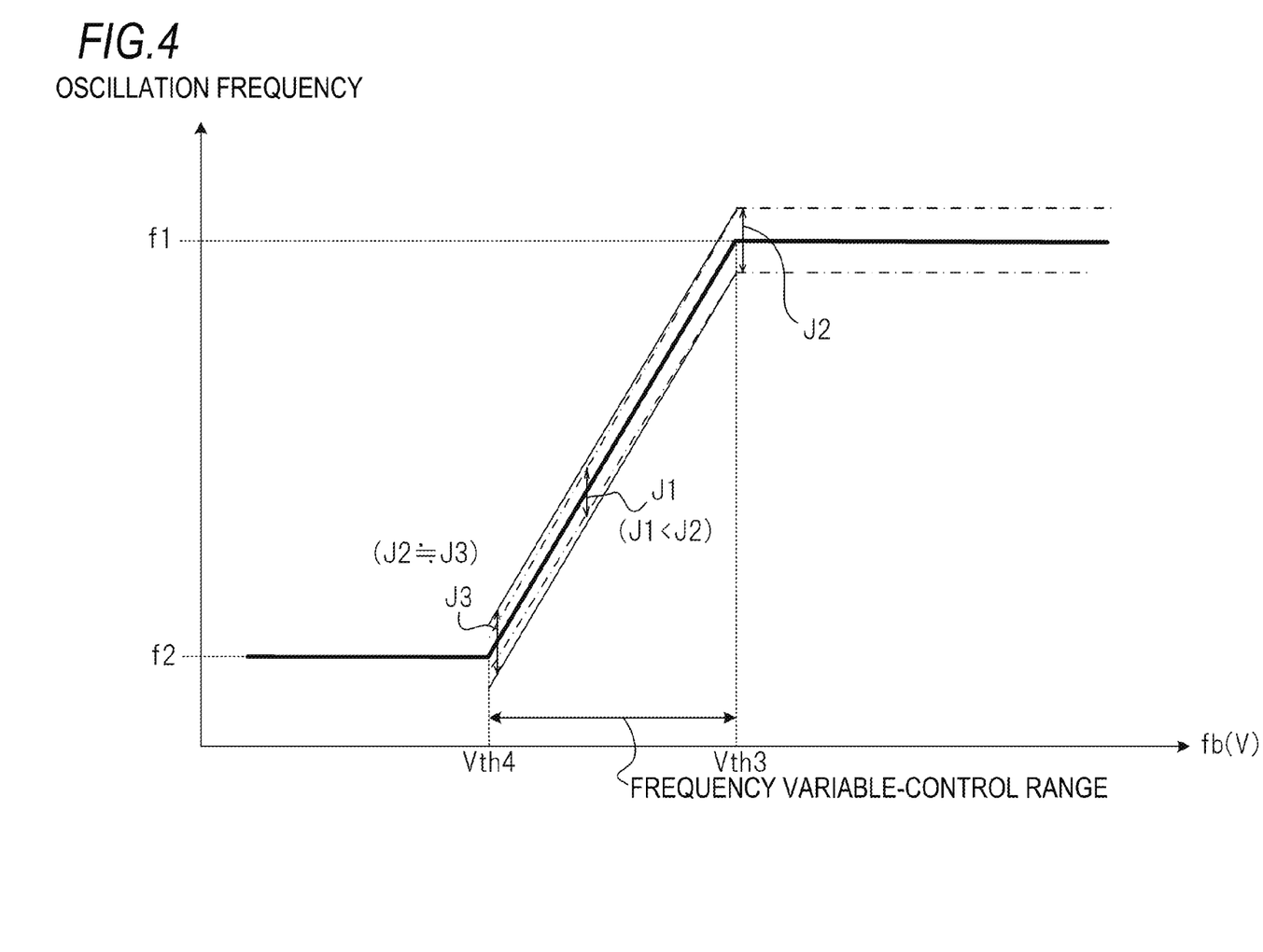
FIG. 4 is a diagram illustrating a change in a switching frequency at the time of operating the switching power-supply device illustrated in FIG. 1.

FIG. 4 is a diagram illustrating a relation between the feedback signal fb and the oscillation frequency of the oscillator 10 in the switching power-supply device illustrated in FIG. 1.

In the graph of FIG. 4, a thick solid line represents the reference frequency of the oscillation frequency set in the oscillator 10. In FIG. 4, an upper limit value and a lower limit value of a jitter range with respect to the reference frequency is denoted by dashed lines.

As can be understood from the dashed lines, the jitter range J1 in the frequency variable-control range has a width smaller than the jitter range J2 of the oscillation frequency out of the frequency variable-control range. This phenomenon occurs due to setting of the jitter range at a constant rate of the reference frequency.

In the switching power-supply device illustrated in FIG. 1, in a state where the feedback signal fb is in the frequency variable-control range, according to the control of the on-period intermittent control unit 70, the on-period extension control in which the on-period of the switching element 14 is extended based on the generated on-drive signal is performed, at the ratio of one to two periods of the pulse signal supplied from the oscillator 10, in other words, every twice generations of an on-drive by the drive signal generating unit 20.

As described above, by alternately repeating the state where the on-period is extended and the state where the on-period is not extended, the feedback signal fb is finely changed, and the oscillation frequency is also changed in synchronization with this fine change under the control of the oscillation frequency control unit 30.

Accordingly, the width of the jitter range J1 in the frequency variable-control range of FIG. 4 can be broadened to be larger than the width denoted by the dashed lines. Accordingly, an EMI noise in the frequency variable-control range can be reduced.

In the switching power-supply device illustrated in FIG. 1, the extended time (a period of the time point t4 to the time point t5 and a period of the time point t9 to time point t10 illustrated in FIG. 3) of the on-period in the on-period extension control is shortened as the feedback signal fb is higher.

Accordingly, in a case where the feedback signal fb transits from a state being in the frequency variable change range to a state being out of the frequency variable-control range, an increase in the change of the drain current flowing through the switching element 14 can be prevented.

Accordingly, a transition from a mode, in which the PWM control is performed and the oscillation frequency is controlled, to a mode, in which the oscillation frequency is fixed (a change in the jitter range is performed) and the PWM control is performed can be easily made.

In the switching power-supply device illustrated in FIG. 1, only in the state where the feedback signal fb is in the frequency variable-control range, the on-period extension control of the switching element 14 is performed. Accordingly, in a state where the feedback signal fb exceeds the frequency variable-control range, an increase in the peak value of the drain current can be prevented, whereby the saturation of the transformer T can be prevented.

In a system where an AC voltage input from the commercial AC power source is 200 V, the increasing speed of the drain current in the state where the switching element 14 is turned on is high, and thus the feedback signal fb tends to be low even at the same oscillation frequency.

In other words, as compared to a case where the AC voltage is a 100 V system, a state where the feedback signal fb is in the frequency variable-control range is lengthened, and a period where the jitter range changes increases. Accordingly, a configuration where the on-period extension control is intermittently performed is effective.

In addition, in the 200 V system, since the peak value of the drain current tends to increase according to the on-period extension control described above, and a configuration where the extension control is performed only in the state where the feedback signal fb is in the frequency variable-control range is particularly effective.

In the above description, the on-period intermittent control unit 70 has been described to perform the on-period extension control every twice generations of on-drive signal by the drive signal generating unit 20.

However, if a configuration where the on-period extension control is performed every plural times of generation of the on-drive by the drive signal generating unit 20 plural times is employed, an effect that constituting the width of the jitter range can be set to be constant in the frequency variable-control range can be acquired. For example, a configuration may be employed where the on-period extension control is performed every three times of generation of the on-drive signal.

The on-period intermittent control unit 70 may be configured not to perform the on-period extension control at regular timing. For example, the timing at which the on-period extension control is performed may be randomly set. By randomly performing the on-period extension control to a degree for which the width of the jitter range is constant in the frequency variable-control range, the effect of EMI reduction can be acquired.

In addition, the on-period intermittent control unit 70 may fix the extended time of the on-period at the time of performing the on-period extension control to a predetermined value. Even when the extended time is fixed, by adjusting the timing at which the on-period extension control is performed, an effect of broadening the jitter range can be acquired.

Figure 5:
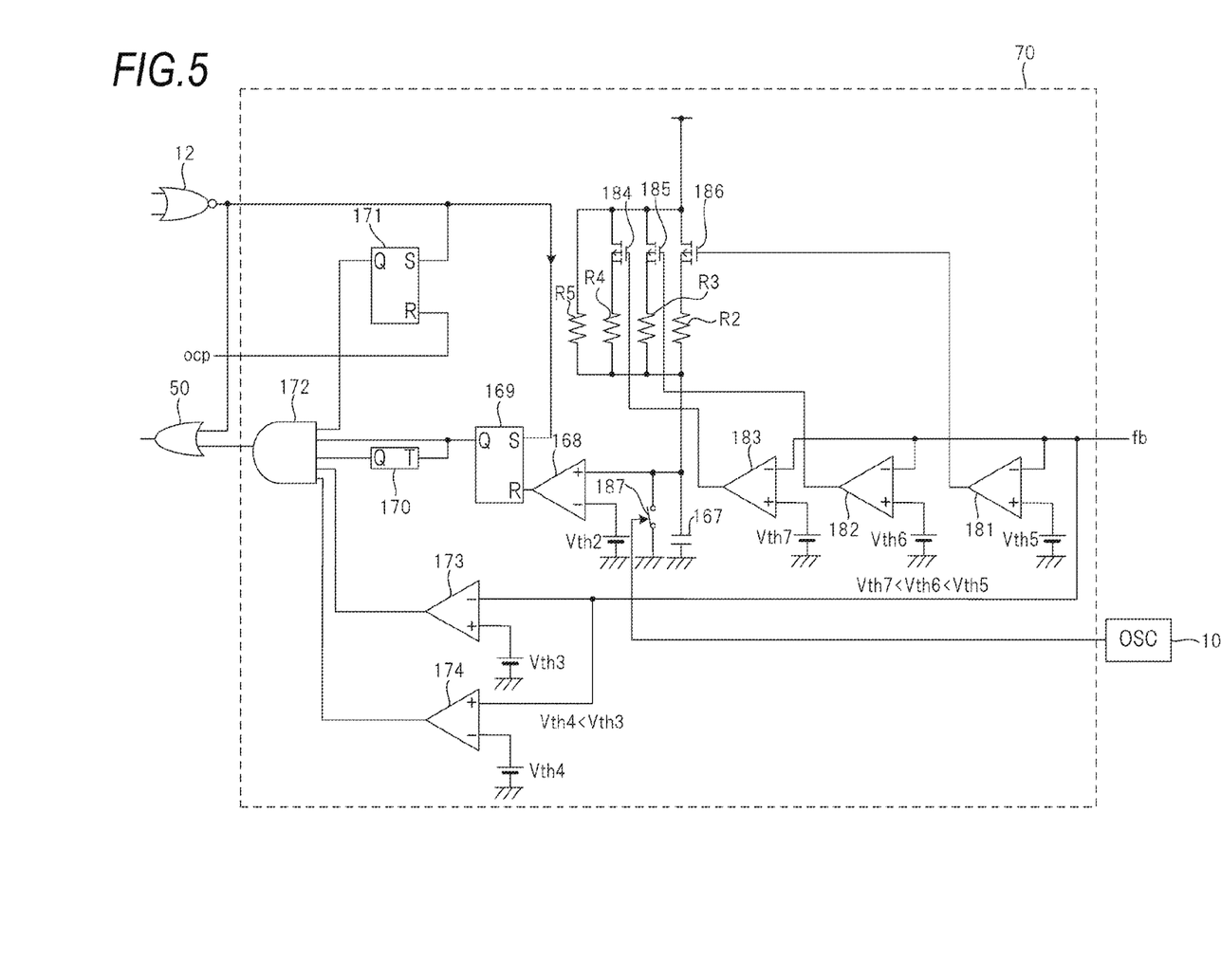
FIG. 5 is a circuit diagram illustrating a modified example of the internal configuration of the on-period intermittent control unit of the switching power-supply device illustrated in FIG. 1.

FIG. 5 is a diagram illustrating a modified example of the internal configuration of the on-period intermittent control unit 70 illustrated in FIG. 2.

An on-period intermittent control unit 70 illustrated in FIG. 5 has a configuration, in which the comparator 161, the bipolar transistor 162, the bipolar transistor 163, the bipolar transistor 164, the resistor 165, and the switch 166 are omitted from the configuration example illustrated in FIG. 2 and in which a comparator 181, a comparator 182, a comparator 183, a resistor R2, a resistor R3, a resistor R4, a resistor R5, a MOSFET 184, a MOSFET 185, a MOSFET 186, and a switch 187 is added. In FIG. 5, the same reference numeral is assigned to the same constituent element as that illustrated in FIG. 2, and description thereof will not be presented.

The comparator 181 is configured such that the feedback signal fb is input to an inverted input terminal, and the threshold voltage Vth5 is input to a non-inverted input terminal. An output terminal of the comparator 181 is connected to a gate of the MOSFET 186.

The comparator 182 is configured such that the feedback signal fb is input to an inverted input terminal, and the threshold voltage Vth6 is input to a non-inverted input terminal. The threshold voltage Vth6 is lower than the threshold voltage Vth5. An output terminal of the comparator 182 is connected to a gate of the MOSFET 185.

The comparator 183 is configured such that the feedback signal fb is input to an inverted input terminal and the threshold voltage Vth7 is input to a non-inverted input terminal. The threshold voltage Vth7 is lower than the threshold voltage Vth6. An output terminal of the comparator 183 is connected to a gate of the MOSFET 184.

Sources of the MOSFET 184, the MOSFET 185, and the MOSFET 186 is are respectively connected to one end of the resistor R4, one end of the resistor R3, and one end of the resistor R2. In addition, drains of the MOSFET 184, the MOSFET 185, and the MOSFET 186 are connected to the power supply line.

Each of the other end of the resistor R4, the other end of the resistor R3, and the other end of the resistor R2 are connected to the capacitor 167.

The resistor R5 is connected between the power supply line and the capacitor 167.

The switch 187 is connected between a connection point of the capacitor 167 and the resistor R2 and the ground terminal. Similar to the switch 166 illustrated in FIG. 2, the opening or closing of the switch 187 is controlled according to an output signal of the oscillator 10.

The operation of the switching power-supply device including the on-period intermittent control unit 70 configured as above will be described.

Operations other than the operation performed in the medium load state are the same as those of the switching power-supply device illustrated in FIG. 1. In the medium load state, when the output of the NOR circuit 12 becomes the high level, the RS-FF 169 and the RS-FF 171 illustrated in FIG. 5 are set, and the input of the T-FF 170 becomes the high level. However, the output of the T-FF 170 is inverted to become the low level, and the output of the AND circuit 172 maintains the low level.

Accordingly, the output of the OR circuit 50 coincides with the output of the NOR circuit 12, and the switching element 14 is turned on in accordance with a drive signal of the high level output from the NOR circuit 12.

Thereafter, when the output of the NOR circuit 12 becomes the high level again, the RS-FF 169 and the RS-FF 171 illustrated in FIG. 5 are set, the output of the T-FF 170 is inverted to become the high level, and the output of the AND circuit 172 becomes the high level. In addition, at the same time, the switch 187 illustrated in FIG. 5 is opened.

Immediately before this timing, since the switch 187 illustrated in FIG. 5 is closed according to the rise of the pulse signal of the oscillator 10, the capacitor 167 is discharged in advance.

In a state where the switch 187 is open, in a first case where the feedback signal fb is the threshold voltage Vth5 or more, all the outputs of the comparator 181, the comparator 182, and the comparator 183 become the low level, and the capacitor 167 is charged through a series circuit of the MOSFET 184 and the resistor R4, a series circuit of the MOSFET 185 and the resistor R3, and a series circuit of the MOSFET 186 and the resistor R2.

In a second case where the feedback signal fb is the threshold voltage Vth6 or more and is less than the threshold voltage Vth5, the outputs of the comparators 182 and 183 among the comparators 181, 182, and 183 become the low level. Then, the capacitor 167 is charged at a speed lower than that of the first case, through the series circuit of the MOSFET 184 and the resistor R4 and the series circuit of the MOSFET 185 and the resistor R3.

In a third case where the feedback signal fb is the threshold voltage Vth7 or more and is less than the threshold voltage Vth6, only the output of the comparator 183 among the comparators 181, 182, and 183 becomes the low level. Then, the capacitor 167 is charged at a speed lower than that of the second case, through the series circuit of the MOSFET 184 and the resistor R4.

As described above, by changing the charging speed of the capacitor 167 in a stepped manner in accordance with the magnitude of the feedback signal fb, the extended time in the on-period extension control can be lengthened further as the feedback signal fb is lower.

As described above, when the capacitor 167 is charged, and the voltage of the capacitor 167 arrives at the threshold voltage Vth2, the RS-FF 169 is reset, the output of the AND circuit 172 becomes the low level, and the on-period of the switching element 14 ends.

As described above, even by changing the extended time of the on-period in a stepped manner based on the feedback signal fb in the on-period extension control, effects similar to those of the switching power-supply device illustrated in FIG. 1 can be acquired.

While the switching power-supply device illustrated in FIG. 1 has been described as an insulation-type switching power-supply device performing the output voltage control by using the transformer T as an example, the configuration of the controller IC 100 can be similarly applied to a non-insulation-type switching power-supply device such as a step-down chopper circuit.

As described above, although the present disclosure has been described using the specific embodiment, the embodiment described above is an example, and it is apparent that the embodiment may be changed in a range not departing from the concept of the present disclosure.

As described above, in the description presented here, the following matters are disclosed.

The disclosed integrated circuit is An integrated circuit used in a switching power-supply device including an inductor and a switching element connected to the inductor in series. The integrated circuit includes: an oscillator, of which an oscillation frequency is variable; an oscillation frequency control unit, which controls the oscillation frequency of the oscillator based on a signal according to an output voltage of the switching power-supply device; a drive signal generating unit, which generates a drive signal used for controlling the switching element based on an output of the oscillator; a drive circuit, which drives the switching element based on the drive signal generated by the drive signal generating unit; and an on-period intermittent control unit, which intermittently performs on-period extension control in which an on-period of the switching element is set to be longer than an on-period based on the drive signal in a state where the oscillation frequency is controlled not to be fixed by the oscillation frequency control unit.

In the disclosed integrated circuit, the on-period intermittent control unit performs the on-period extension control every plural times of generation of an on-drive signal used for turning on the switching element by the drive signal generating unit.

In the disclosed integrated circuit, the on-period intermittent control unit lengthens an extended time of the on-period in the on-period extension control as the oscillation frequency of the oscillator is lower.

In the disclosed integrated circuit, the drive signal generating unit controls a width of an on-drive signal used for turning on the switching element, based on a signal according to a current flowing through the switching element and a signal according to the output voltage of the switching power-supply device, the oscillation frequency control unit lowers the oscillation frequency as a level is lower in a case where the level of the signal according to the output voltage of the switching power-supply is in a predetermined range, and the oscillation frequency control unit fixes the oscillation frequency to a predetermined value in a case where the level of the signal according to the output voltage of the switching power-supply device is out of the range, and a state where the oscillation frequency is controlled according to the level by the oscillation frequency control unit is the state where the oscillation frequency is controlled not to be fixed.

The disclosed switching power-supply device includes: an inductor; a switching element connected to the inductor in series; and the integrated circuit described above.

The invention claimed is:

1. An integrated circuit used in a switching power-supply device including an inductor and a switching element connected to the inductor in series, the integrated circuit comprising:

an oscillator having an oscillation frequency which is variable;

an oscillation frequency control unit, which controls the oscillation frequency of the oscillator based on a signal according to an output voltage of the switching power-supply device;

a drive signal generating unit, which generates a drive signal used for controlling the switching element based on an output of the oscillator;

a drive circuit, which drives the switching element based on the drive signal generated by the drive signal generating unit; and an on-period intermittent control unit, which intermittently performs on-period extension control in which an on-period of the switching element is set to be longer than an on-period based on the drive signal, in a state where the oscillation frequency is controlled not to be fixed by the oscillation frequency control unit, wherein the on-period intermittent control unit lengthens an extended time of the on-period in the on-period extension control as the oscillation frequency of the oscillator decreases.

2. The integrated circuit according to claim 1, wherein the on-period intermittent control unit performs the on-period extension control each time an on-drive signal used for turning on the switching element is generated by the drive signal generating unit.

3. The integrated circuit according to claim 1, wherein the drive signal generating unit controls a width of an on-drive signal used for turning on the switching element, based on a signal according to a current flowing through the switching element and a signal according to the output voltage of the switching power-supply device, wherein the oscillation frequency control unit lowers the oscillation frequency as a level decreases in a case where the level of the signal according to the output voltage of the switching power-supply device is in a predetermined range, and the oscillation frequency control unit fixes the oscillation frequency to a predetermined value in a case where the level of the signal according to the output voltage of the switching power-supply device is out of the predetermined range, and wherein a state where the oscillation frequency is controlled according to the level by the oscillation frequency control unit is the state where the oscillation frequency is controlled not to be fixed.

4. A switching power-supply device comprising:

an inductor;

a switching element connected to the inductor in series; and the integrated circuit according to claim 1.

* * * * *